United States Patent
Kronholz et al.

(10) Patent No.: US 8,124,467 B2
(45) Date of Patent: Feb. 28, 2012

(54) REDUCING SILICIDE RESISTANCE IN SILICON/GERMANIUM-CONTAINING DRAIN/SOURCE REGIONS OF TRANSISTORS

(75) Inventors: Stephan Kronholz, Dresden (DE); Vassilios Papageorgiou, Austin, TX (US); Maciej Wiatr, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 12/749,619

(22) Filed: Mar. 30, 2010

(65) Prior Publication Data
US 2010/0244107 A1 Sep. 30, 2010

(30) Foreign Application Priority Data
Mar. 31, 2009 (DE) .................. 10 2009 015 748

(51) Int. Cl.
H01L 21/336 (2006.01)
H01L 21/20 (2006.01)
H01L 21/04 (2006.01)
H01L 21/44 (2006.01)

(52) U.S. Cl. ......... 438/197; 438/478; 438/510; 438/682
(58) Field of Classification Search .................. None
See application file for complete search history.

(56) References Cited

U.S. PATENT DOCUMENTS

| | | | |
|---|---|---|---|
| 6,274,894 B1 * | 8/2001 | Wieczorek et al. | 257/192 |
| 7,554,110 B2 * | 6/2009 | Yu et al. | 257/18 |
| 7,723,174 B2 * | 5/2010 | Waite et al. | 438/216 |
| 7,791,064 B2 * | 9/2010 | Shimamune et al. | 257/19 |
| 2006/0138398 A1 | 6/2006 | Shimamune et al. | 257/19 |
| 2008/0067609 A1 | 3/2008 | Kim et al. | 257/384 |
| 2008/0119031 A1 * | 5/2008 | Pal et al. | 438/483 |
| 2008/0246057 A1 * | 10/2008 | Lin et al. | 257/190 |
| 2008/0290370 A1 | 11/2008 | Han et al. | 257/192 |
| 2009/0108308 A1 * | 4/2009 | Yang et al. | 257/288 |

OTHER PUBLICATIONS

Wang et al., "Performance enhancement schemes featuring lattice mismatched S/D stressors concurrently realized on CMOS platform: e-SiGeSn S/D for pFETs by Sn+ implant and SiC S/D for nFETs by C+ implant," *2008 Symposium on VLSi Technology Digest of Technical Papers*, pp. 207-208, Jun. 2008.

Translation of Official Communication from German Patent Office for German Patent Application No. 10 2009 015 748.4 dated Mar. 3, 2010.

* cited by examiner

Primary Examiner — Scott B Geyer
(74) Attorney, Agent, or Firm — Williams, Morgan & Amerson, P.C.

(57) ABSTRACT

In sophisticated P-channel transistors, a high germanium concentration may be used in a silicon/germanium alloy, wherein an additional semiconductor cap layer may provide enhanced process conditions during the formation of a metal silicide. For example, a silicon layer may be formed on the silicon/germanium alloy, possibly including a further strain-inducing atomic species other than germanium, in order to provide a high strain component while also providing superior conditions during the silicidation process.

18 Claims, 5 Drawing Sheets

REDUCING SILICIDE RESISTANCE IN SILICON/GERMANIUM-CONTAINING DRAIN/SOURCE REGIONS OF TRANSISTORS

BACKGROUND OF THE INVENTION

1. Field of the Invention

Generally, the present disclosure relates to integrated circuits, and, more particularly, to transistors having enhanced performance by using a silicon/germanium (Si/Ge) in the drain/source regions to enhance charge carrier mobility in the channel region of the transistor.

2. Description of the Related Art

The fabrication of integrated circuits requires the formation of a large number of circuit elements, wherein the field effect transistor may represent an important component in advanced logic circuit designs. Generally, a plurality of process technologies are currently practiced for forming field effect transistors, wherein, for complex circuitry, such as microprocessors, storage chips and the like, CMOS technology is currently the most promising approach due to the superior characteristics in view of operating speed and/or power consumption and/or cost efficiency. During the fabrication of complex integrated circuits using CMOS technology, millions of transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely or weakly doped channel region disposed between the drain region and the source region. The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the overall conductivity of the channel region substantially determines the performance of the MOS transistors. Thus, the reduction of the channel length, and associated therewith the reduction of the channel resistivity, is a dominant design criterion for accomplishing an increase in the operating speed of the integrated circuits.

The continuing shrinkage of the transistor dimensions, however, entails a plurality of issues associated therewith that have to be addressed so as to not unduly offset the advantages obtained by steadily decreasing the channel length of MOS transistors. For example, with a reduced channel length, the control of the channel region may become increasingly difficult, which is also referred to as short channel effect. Hence, various design measures, such as sophisticated dopant profiles, increased capacitive coupling of the gate electrode to the channel region and the like, have been developed, some of which may, however, negatively affect the charge carrier mobility in the channel region or may otherwise compromise the transistors. In view of this situation and since the continuous size reduction of the critical dimensions, i.e., the gate length of the transistors, necessitates the adaptation of existing complex processes and possibly the new development of highly complex process techniques, it has been proposed to also enhance the channel conductivity of the transistor elements by increasing the charge carrier mobility in the channel region for a given channel length, thereby achieving a performance improvement that is comparable with the advance to a future technology node while avoiding or at least postponing many of the above process adaptations associated with device scaling.

One efficient mechanism for increasing the charge carrier mobility is the modification of the lattice structure in the channel region, for instance by creating tensile or compressive stress so as to produce a corresponding strain in the channel region, which results in a modified mobility for electrons and holes, respectively. For example, creating uniaxial tensile strain in the channel region along the channel increases the mobility of electrons, which, in turn, may directly translate into a corresponding increase in the conductivity of N-channel transistors. On the other hand, compressive strain in the channel region may increase the mobility of holes, thereby providing the potential for enhancing the performance of P-type transistors. The introduction of stress or strain engineering in the fabrication process of integrated circuits is an extremely promising approach, since, for example, strained silicon may be considered as a "new" type of semiconductor material, which may enable the fabrication of fast powerful semiconductor devices without requiring new expensive semiconductor materials and manufacturing techniques adapted to these new materials.

An efficient mechanism for enhancing the hole mobility of PMOS transistors may be implemented by forming a strained silicon/germanium alloy in the drain and source regions of the P-channel transistors, wherein the compressively strained drain and source regions create uniaxial strain in the adjacent silicon channel region. To this end, the drain and source regions of the PMOS transistors are selectively recessed, while the NMOS transistors are masked and subsequently the silicon/germanium layer is selectively formed in the PMOS transistor by epitaxial growth. Although this technique offers significant advantages in view of performance gain of the PMOS transistor and thus of the entire CMOS device, if an appropriate design is used that balances the performance gain of the PMOS transistor, a performance gain less than expected may be obtained in advanced applications, when higher germanium concentrations are used to further enhance the strain level in the channel region and thus increasing the hole mobility.

Generally, a higher germanium concentration of the silicon/germanium alloy may result in a more pronounced lattice mismatch between the strain-inducing alloy and the silicon template material, which is considered advantageous for further increasing the hole mobility in the corresponding drain and/or source regions of P-channel transistors. It turns out, however, that an increased germanium concentration may result in a more pronounced interaction of the silicon/germanium alloy with materials and processes that are to be applied during the further processing of the semiconductor device. For example, the chemical reaction and thus modification of the silicon/germanium alloy with respect to a plurality of processes, such as cleaning processes, oxidation processes, etch processes and the like, may be higher compared to substantially pure silicon material, thereby contributing to additional material loss, which may finally result in a less pronounced gain in performance. Additionally, the increased degree of material loss of the silicon/germanium alloy compared to the drain and source regions of N-channel transistors may also result in a loss of dopant species, thereby increasing the series resistance of the corresponding drain and source areas in the P-channel transistor. For this reason, in some conventional approaches, a very pronounced overfill during the selective epitaxial growth process may be applied in order to compensate for the increased material loss during the further processing, which may, however, lead to a negative effect, such as pronounced surface topography, increased transistor variability, reduced throughput in the epitaxial growth process and the like.

Moreover, upon increasing the germanium concentration, which may be considered appropriate for enhancing hole mobility, as discussed above, a desired reduction of the overall resistance of the drain/source path in P-channel transistors may be less pronounced or may even be overcompensated for by process irregularities during the formation of a metal silicide in the drain and source regions. It is well known that metal silicide, such as cobalt silicide, nickel silicide, nickel/platinum silicide and the like, may have a significantly lower resistivity compared to even highly doped silicon material. For this reason, the overall series resistance in sophisticated P-channel transistors may be significantly reduced by providing the metal silicide regions, which may also represent contact areas for contact elements that may be formed in a contact structure that encloses and passivates the transistor elements. During the metal silicide formation, after cleaning and thus preparing exposed semiconductor surface areas for the subsequent manufacturing sequence, a layer of refractory metal is deposited and subsequently annealed in order to initiate a chemical reaction between the refractory metal and the silicon species in the drain and source regions. Thereafter, non-reacted metal may be removed on the basis of well-established selective wet chemical etch recipes. Thereafter, if required, additional treatments such as heat treatments may be performed in order to obtain a stable form of the metal silicide, which may have a desired low resistance state. During the subsequent processing, an interlayer dielectric material is deposited, for instance in the form of silicon nitride and silicon dioxide, which is then patterned to receive contact openings, wherein the associated etch process may finally stop on and in the metal silicide regions. Consequently, the characteristics of the metal silicide may represent an important aspect with respect to the overall performance of the transistor elements since the metal silicide significantly determines the overall series resistance and also acts as an etch stop material during the complex patterning process for forming the contact openings.

It has been observed that an increased germanium concentration in the drain and source regions of P-channel transistors may have a significant influence on the characteristics of the metal silicide material, which may result in a reduced stability, which in turn may result in a reduced conductivity and a modified etch behavior. Consequently, a gain in performance of sophisticated P-channel transistors may be difficult to be achieved on the basis of increasing the germanium concentration, even if a significant overfill during the selective epitaxial growth process may be applied, due to the inferior characteristics of the resulting metal silicide regions, as explained above.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein relates to semiconductor devices and techniques in which a strained silicon/germanium alloy with a moderately high germanium concentration may be used without requiring significant overfill, while also reducing process irregularities during the formation of a metal silicide material. For this purpose, a semiconductor material having a significantly reduced germanium concentration may be formed on the silicon/germanium alloy at an appropriate manufacturing stage so as to provide a silicon-containing semiconductor material for the formation of metal silicide, thereby significantly reducing the probability of creating unstable metal silicide materials, which may frequently be encountered in conventional strategies in which high germanium concentration may be required. The silicon-containing semiconductor material may be provided in the form of a substantially "pure" silicon material, i.e., a silicon material including a dopant species in accordance with a corresponding dopant concentration, while substantially avoiding the incorporation of other atomic species, such as germanium, so as to provide similar process conditions in semiconductor areas having formed therein a silicon/germanium alloy and other semiconductor areas without a strain-inducing silicon/germanium alloy. In other illustrative embodiments disclosed herein, at least a significantly reduced germanium concentration may be provided in the silicon-containing semiconductor material, for instance with an amount of approximately 5 atomic percent germanium and less, thereby also contributing to significantly enhanced overall process conditions during the formation of a metal silicide. In still other aspects disclosed herein, a desired degree of compressive strain may nevertheless be generated on the basis of the silicon-containing semiconductor material by incorporating an atomic species having a greater covalent radius compared to germanium so that a moderately high compressive strain may be induced without requiring a germanium component. Moreover, due to the increased covalent radius of the specific atomic species, a moderately low concentration thereof may also be sufficient, thereby not causing irregularities during the formation of a metal silicide in the drain and source regions. In some illustrative embodiments, the silicon-containing semiconductor material may be provided in a late manufacturing stage, for instance immediately prior to the deposition of a refractory metal, thereby contributing to a high degree of compatibility to conventional strategies performed on the basis of a reduced germanium concentration, while at the same time achieving superior characteristics of the metal silicide due to the presence of the silicon-containing semiconductor material.

One illustrative method disclosed herein comprises forming a cavity in a semiconductor region laterally adjacent to a gate electrode structure of a transistor. The method further comprises forming a strain-inducing silicon/germanium alloy in the cavity, wherein the silicon/germanium alloy has a first silicon concentration. The method further comprises forming a silicon-containing semiconductor material on the strain-inducing silicon/germanium alloy, wherein the silicon-containing semiconductor material has a second silicon concentration that is greater than the first silicon concentration. Additionally the method comprises forming drain and source regions at least partially in the silicon/germanium alloy and the silicon-containing semiconductor material and forming a metal silicide in the silicon-containing semiconductor material.

A further illustrative method disclosed herein comprises forming a silicon-containing semiconductor material on a silicon/germanium alloy that is formed in an active region of a P-type transistor. The silicon-containing semiconductor region has a germanium concentration that is less than a germanium concentration of the silicon/germanium alloy. Additionally, the method comprises forming a metal silicide locally restricted to the silicon-containing semiconductor material.

One illustrative semiconductor device disclosed herein comprises a gate electrode structure formed above a silicon-containing semiconductor region. Furthermore, the semiconductor device comprises drain and source regions formed in the silicon-containing semiconductor region. Additionally, a silicon/germanium alloy is formed at least partially in the drain region and/or the source region, wherein the silicon/germanium alloy has a first germanium concentration. Moreover, the semiconductor device comprises a metal silicide that is at least partially formed in the drain and source regions and that has a second germanium concentration that is less than the first germanium concentration.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein provides semiconductor devices and efficient manufacturing techniques which may enable a significant reduction of disadvantageous effects on the performance of P-type transistors when using silicon/germanium alloys in drain and/or source areas with a moderately high concentration of germanium. As previously explained, with germanium concentrations of approximately 25 atomic percent and even higher, which would be highly desirable in view of enhancing hole mobility in the channel region of P-channel transistors, in conventional techniques, a significantly reduced performance gain or even a reduced performance may be observed. In order to reduce at least some of these negative effects caused by the high germanium concentration, the present disclosure provides a manufacturing strategy in which, at least during the formation of metal silicide materials, enhanced process conditions may be established in order to at least reduce any instabilities and irregularities which may be associated with a high germanium concentration in a metal silicide material. To this end, a silicon-containing semiconductor material may be formed on the silicon/germanium alloy, which may have a significantly reduced germanium concentration or which may substantially lack any germanium species, thereby providing enhanced conditions for forming a metal silicide in the silicon-containing semiconductor material. In some illustrative embodiments, this "cap" material may be formed in situ with the silicon/germanium alloy having the moderately high germanium concentration so that a desired high degree of lattice mismatch may be achieved between the silicon/germanium alloy and the silicon-based template material in the active semiconductor region, wherein the subsequently deposited cap material may have a significantly reduced thickness compared to the semiconductor alloy, thereby not significantly contributing to an overall reduced strain component. Consequently, well-established and efficient locally selective epitaxial growth techniques may be applied on the basis of an increased germanium concentration, for instance in the range of approximately 25 atomic percent germanium and higher, wherein the high germanium concentration may be reliably confined by the cap layer, which thus may provide superior conditions during the further processing and in particular during the formation of a metal silicide.

In other illustrative embodiments disclosed herein, well-established deposition recipes may be applied for forming the silicon/germanium alloy with a high germanium concentration, wherein, afterwards, a silicon base material may be formed, for instance during the same epitaxial growth process, strain-inducing characteristics of which may then be adapted so as to maintain a certain degree of compressive strain. For this purpose, an atomic species may be incorporated into the silicon base layer that has a significantly large covalent radius compared to germanium, wherein the valence of the atomic species under consideration may be substantially identical to silicon or germanium with respect to a covalent bonding structure in a diamond-like crystalline structure. In one illustrative embodiment, the atomic species may comprise tin that has a covalent radius of 1.40 Å, which is larger than the covalent radius of silicon of 1.17 Å and the covalent radius of germanium of 1.22 Å. Consequently, an increased lattice mismatch may be accomplished by incorporating the atomic species, wherein a significantly reduced overall concentration of this atomic species may be required for obtaining a desired high compressive strain component. Thus, the presence of a germanium component may be significantly reduced or may be substantially suppressed in the cap material, while the incorporation of the atomic species having the enlarged covalent radius may provide a desired degree of compressive strain while at the same time providing superior conditions during the further processing of the device, for instance, for forming a metal silicide. That is, during the corresponding metal silicide formation process, a significantly reduced amount of non-silicon species may be encountered by the refractory metal during the chemical reaction, thereby resulting in superior material characteristics compared to metal silicide having incorporated therein a moderately high concentration of germanium. In some illustrative embodiments, the atomic species may be incorporated during an epitaxial growth process, while, in other cases, an ion implantation process may be performed at any appropriate manufacturing stage.

In still other illustrative embodiments disclosed herein, the silicon-containing semiconductor material may be provided in a late manufacturing stage, i.e., immediately prior to the metal silicide formation sequence, thereby providing a high degree of compatibility with conventional process strategies and also providing a moderately high strain component in the vicinity of the channel region, since the cap material may be formed with lateral offset to the channel region that is determined by a corresponding spacer structure. Moreover, well-established and well-controllable single step epitaxial growth techniques may be applied for forming the silicon/germanium alloy having the high germanium concentration without requiring an adaptation of process parameters during the process.

Figure 1A:
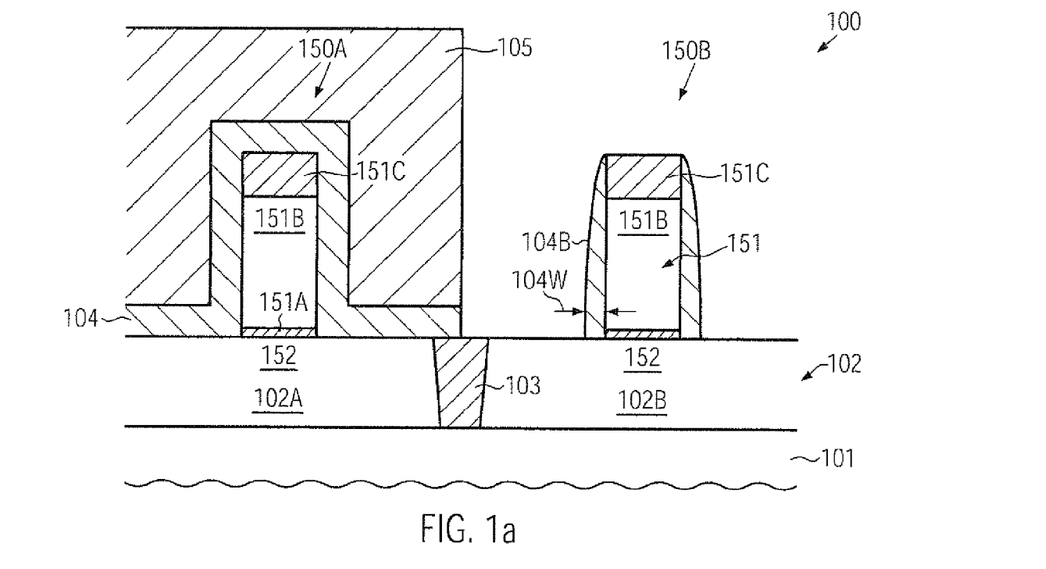
FIGS. 1a-1c schematically illustrate cross-sectional views of a semiconductor device comprising a transistor element during various manufacturing stages in forming a silicon/germanium alloy having a moderately high germanium concentration for enhancing overall performance of at least one type of transistor, according to illustrative embodiments.

FIG. 1a schematically illustrates a cross-sectional view of a semiconductor device 100 comprising a substrate 101 above which may be formed a semiconductor layer 102. The semiconductor layer 102 may represent a silicon-containing semiconductor material which may thus comprise a high fraction of silicon in a crystalline state, the electronic characteristics of which may be enhanced, at least locally, on the basis of a strain inducing mechanism. The substrate 101 and the semiconductor layer 102 may represent a silicon-on-insulator (SOI) configuration if a buried insulating layer (not shown) is positioned between the substrate 101 and the semiconductor layer 102. In other cases, the semiconductor layer 102 may be formed on a crystalline semiconductor material of the substrate 101, thereby providing a "bulk" configuration. It should be appreciated that an SOI configuration and a bulk configuration may be concurrently used in the device 100 in different device areas if considered advantageous. Furthermore, an isolation structure 103 may be provided in the semiconductor layer 102 and may define therein corresponding active regions 102A, 102B, which are to be understood as semiconductor regions having formed therein or receiving an appropriate dopant profile, as required for forming transistor elements. In the manufacturing stage shown in FIG. 1a, the active regions 102A, 102B may correspond to the active region of a first transistor 150A and a second transistor 150B, which may represent an N-channel transistor and a P-channel transistor, respectively. Furthermore, the transistors 150A, 150B may comprise a gate electrode structure 151, which may comprise an electrode material 151B, such as silicon, silicon/germanium, metal-containing materials and the like, followed by a cap layer 151C, such as a silicon nitride material. Moreover, the gate electrode structure 151 may comprise a gate insulation layer 151A that separates the electrode material 151B from a channel region 152 of the transistors 150A, 150B. Furthermore, in the transistor 150A, the gate electrode structure 151 may be encapsulated by a spacer layer 104, which also covers the active region 102A. On the other hand, the electrode material 151B of the gate electrode structure 151 of the transistor 150B may be encapsulated by the cap layer 151C and a sidewall spacer 104B, which may be comprised of silicon nitride and the like. A width 104W of the spacer 104B may substantially define a lateral offset of a cavity to be formed in the active region 102B.

The semiconductor device 100 as shown in FIG. 1a may be formed on the basis of the following processes. After forming the isolation structure 103, involving sophisticated lithography, etch, deposition, planarization techniques and the like, the basic doping of the active regions 102A, 102B may be established, for instance, by ion implantation. Next, the gate electrode structures 151 may be formed by forming an appropriate layer stack and patterning the same on the basis of sophisticated lithography and etch techniques. Thereafter, the spacer layer 104 may be deposited and an etch mask 105, such as a resist mask, may be formed so as to cover the spacer layer 104 above the transistor 150A, while exposing the layer 104 above the transistor 150B. Thereafter, an anisotropic etch process may be performed so as to etch the exposed portion of the spacer layer 104, thereby forming the spacer element 104B.

Figure 1B:
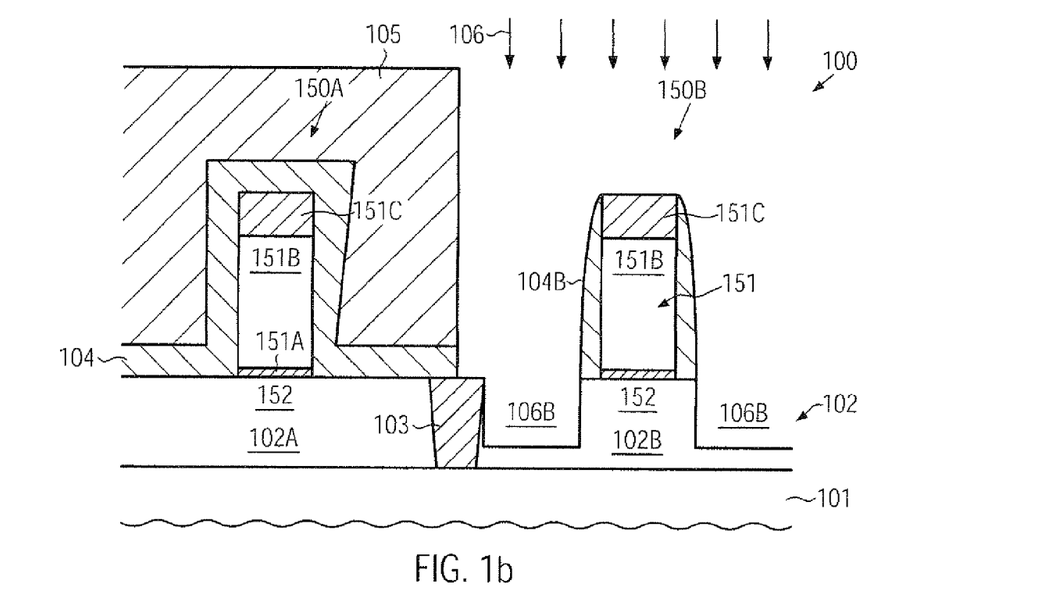

FIG. 1b schematically illustrates the semiconductor device 100 in a further advanced manufacturing stage. As illustrated, an etch process 106 may be performed, for instance on the basis of the etch mask 105, while, in other cases, the mask 105 may be removed if considered appropriate for the further processing. In other cases, the etch process 106 may represent an etch sequence for forming the spacer element 104B and subsequently etching into the exposed portion of the active region 102B in order to form cavities 106B. It should be appreciated that, typically, the cavity may be formed at both sides of the gate electrode structure 151, while, in other cases, one of these sides may be masked if an asymmetric transistor configuration with respect to a silicon/germanium alloy is to be provided. It should further be appreciated that the cavities 106B may be formed on the basis of a substantially anisotropic etch behavior accomplished on the basis of a plasma assisted etch ambient, while, in other cases, the size of the cavities 106B may be obtained by wet chemical etch chemistries, which may have a crystallographic anisotropic etch behavior, or on the basis of a combination of plasma assisted and wet chemical etch chemistries.

Figure 1C:
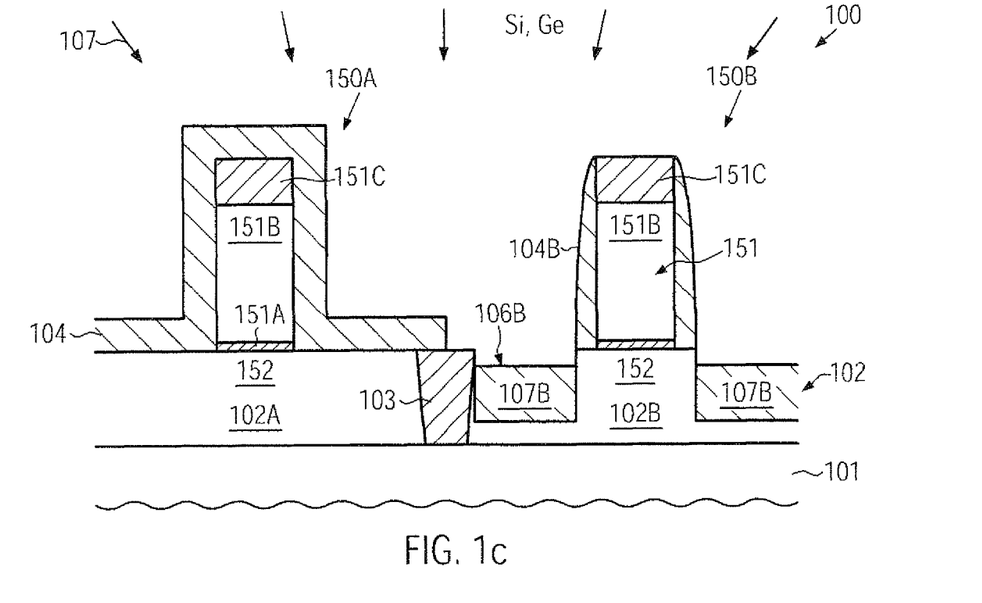

FIG. 1c schematically illustrates the semiconductor device 100 in a further advanced manufacturing stage. As shown, the device 100 may be exposed to a deposition ambient 107, which may be established on the basis of a silicon- and germanium-containing precursor gas and appropriate process parameters in order to obtain a selective deposition of a silicon/germanium alloy 107B within the cavities 106B, while substantially avoiding a material deposition on dielectric surface areas, such as the spacer layer 104, the cap layer 151C, the spacer 104B and the isolation structure 103. Consequently, the exposed portion of the active region 102B may act as a template material so that the silicon/germanium alloy 107B may substantially take on the crystalline structure and the lattice spacing of the template material, thereby forming the material 107B in a strained state, wherein the degree of lattice mismatch and thus the degree of strain may substantially depend on the germanium concentration, as previously explained. During the selective epitaxial growth process 107, the material 107B may be formed up to a desired height level within the cavities 106B so that a further semiconductor material may be formed on the silicon/germanium alloy 107B such that a desired overall height or filling of the cavities 106B may be achieved. For example, a remaining height of the cavities 106B of approximately one to several nanometers may be maintained during the deposition process 107. Consequently, a pronounced overfilling of the cavities 106B may be avoided, thereby contributing to advanced overall throughput of the selective epitaxial growth process 107. Consequently, the silicon/germanium alloy 107B may be formed on the basis of well-established deposition recipes, wherein a germanium concentration may be adjusted to approximately 25 atomic percent germanium or higher.

Figure 1D:
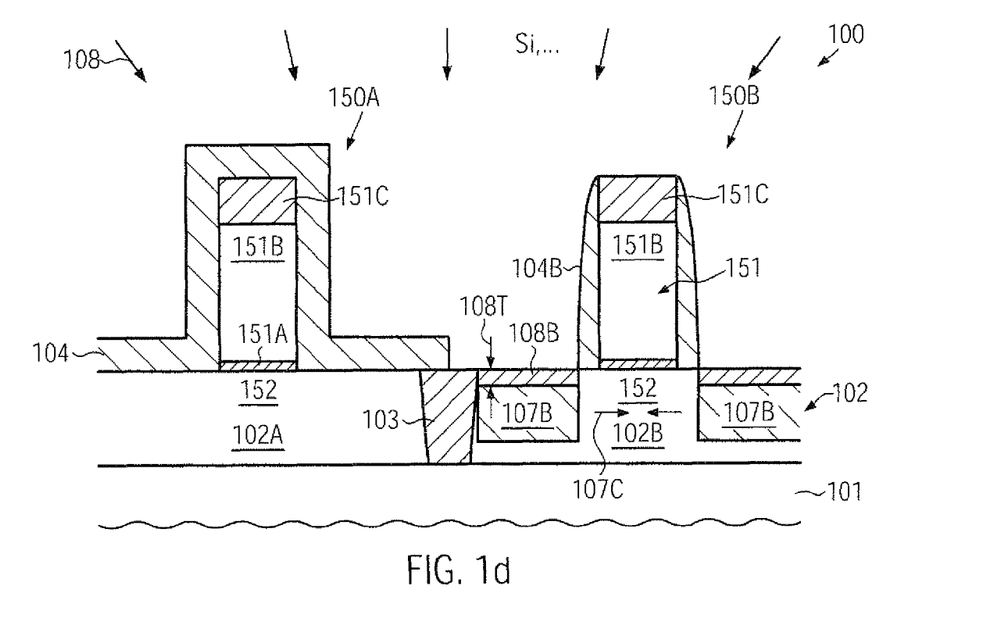
FIG. 1d schematically illustrates the semiconductor device in a further advanced manufacturing stage in which a "silicon rich" semiconductor material or a substantially pure silicon material may be formed on the silicon/germanium alloy so as to act as a cap layer for the further processing and in particular for forming metal silicide regions in a later manufacturing stage, according to illustrative embodiments.

FIG. 1d schematically illustrates the semiconductor device 100 during a further epitaxial deposition process 108, during which a silicon-containing semiconductor material 108B may be formed on the silicon/germanium alloy 107B. The semiconductor material 108B may have a reduced germanium concentration compared to the alloy 107B, thereby providing superior process conditions during the further processing of the device 100, for instance in view of material loss and the like and, in particular, with respect to forming a metal silicide. For instance, the material 108B may be provided in the form of a silicon/germanium alloy with a maximum germanium concentration of approximately 5 atomic percent or less, such as 1 atomic percent and less. In still other illustrative embodiments, the material layer 108B may be provided in the form of a substantially "pure" silicon material, i.e., with a germanium concentration of approximately 0 atomic percent, wherein, however, if required, additional dopant species may be incorporated into the material 108B. The selective epitaxial growth process 108 may be performed in situ with the process 107 (FIG. 1c), that is, in some illustrative embodiments, the processes 107, 108 may be performed in the same process chamber by discontinuing the supply of a germanium-containing precursor material or by at least reducing the flow rate thereon. It should be appreciated that, in this case, a more or less pronounced transition area or interface between the materials 107B and 108B may be obtained, in which a decreasing germanium concentration may be observed with increasing height. In other illustrative embodiments, the processes 107, 108 may be performed as different deposition steps, if considered appropriate. In some illustrative embodiments, a thickness 108T of the cap layer 108B may be selected such that a metal silicide to be formed in a later manufacturing stage may be accommodated in the layer 108B, that is, a material consumption during the further processing of the device 100 and during a corresponding metal silicide process may be equal to or less than the thickness 108T. In this case, the metal silicide to be formed at a later stage may be substantially restricted to the layer 108B having the significantly reduced germanium concentration. For this purpose, the overall material consumption may be determined on the basis of previously processed substrates and an appropriate target thickness during the deposition process 108 may be obtained from the previous measurement results.

As a consequence, after the deposition of the cap layer 108B, a compressive strain component 107C in the channel region 152 may be substantially determined by the material 107B, i.e., by the corresponding germanium concentration and the lateral offset from the channel region 152.

Figure 1E:
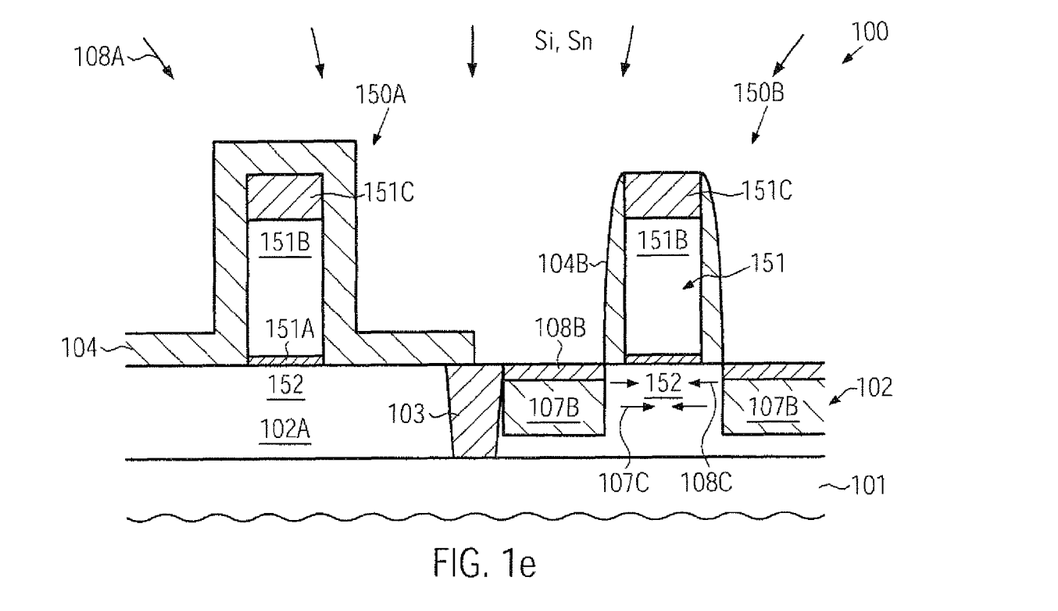
FIGS. 1e-1g schematically illustrate cross-sectional views of the semiconductor device according to still further illustrative embodiments in which an atomic species of the same valency as silicon and having a greater covalent radius may be incorporated into the silicon-containing cap layer formed on the silicon/germanium alloy to provide superior characteristics during the further processing and concurrently induce a moderately high compressive strain.

FIG. 1e schematically illustrates the semiconductor device 100 according to further illustrative embodiments in which the cap layer 108B may be provided with a significantly reduced germanium concentration and also with a reduced concentration of non-silicon species, while at the same time providing a certain compressive strain component 108C. For this purpose, a selective epitaxial deposition process 108A may be performed, for instance as an in situ process, as previously explained, in which an appropriate atomic species having an increased covalent radius may be incorporated. In one illustrative embodiment, the atomic species may be provided in the form of tin (Sn), which may have a greater covalent radius compared to germanium. For example, during the epitaxial growth process 108A, tin hydride ($SnH_4$) may be introduced into the deposition ambient in combination with a silicon-containing precursor material in order to incorporate a desired fraction of tin. For example, after forming the silicon/germanium alloy, which may be accomplished by using a germanium hydride ($GeH_4$) precursor, the supply of this gas component may be discontinued and a tin hydride may be applied to the reaction chamber wherein a significantly reduced fraction of tin may result in a moderately high compressive strain component due to the moderately high covalent radius. Consequently, the material 108B may be provided so as to have a high degree of compatibility with a silicon material used in other device areas, such as the active region 102A, due to a moderately low fraction of non-silicon species contained therein, while nevertheless contributing to the overall strain in the channel region 152.

Figure 1F:
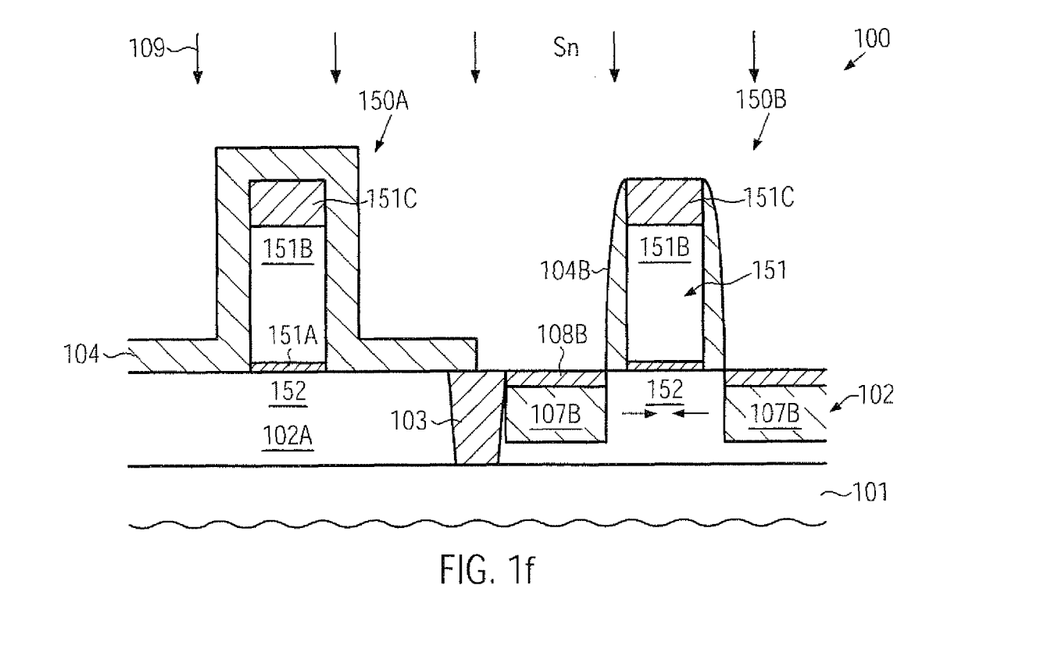

FIG. 1f schematically illustrates the semiconductor device 100 according to still further illustrative embodiments in which an atomic species, such as tin, may be incorporated in the layer 108B on the basis of an ion implantation process 109. For this purpose, the layer 108B may be previously formed, for instance as explained with reference to FIG. 1d, for instance in the form of a substantially germanium-free silicon-based material, and afterwards the implantation process 109 may be performed to incorporate a certain fraction of an atomic species, such as tin. In the embodiment shown in FIG. 1*f*, the implantation process 109 may be performed after growing the materials 107B, 108B in the presence of the spacer layer 104, which may also act as an efficient implantation mask since the species having the increased covalent radius may be incorporated into the layer 108B only, thereby requiring moderately low implantation energies. In other illustrative embodiments, the implantation process 109 may be performed in a later manufacturing stage, for instance after forming respective drain and source regions in the active region 102B, if considered appropriate. Thus, based on the implantation process 109, a concentration of approximately 0.5 to 1 atomic percent or higher of tin may be incorporated into the layer 108B, thereby also providing a certain compressive strain component, substantially without unduly affecting the "response" of the material 108B during the further processing and in particular during the formation of a metal silicide.

Figure 1G:
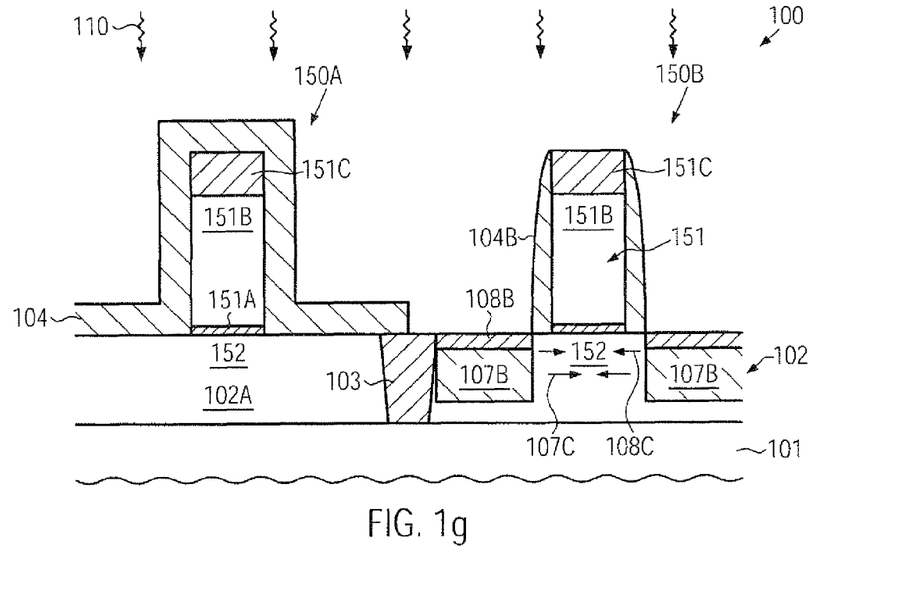

FIG. 1*g* schematically illustrates the semiconductor device 100 during an anneal process, during which implantation-induced damage may be re-crystallized, while also "activating" the atomic species, i.e., positioning the atomic species at lattice sites in the material layer 108B. For instance, the anneal process 110 may be performed on the basis of any well-established techniques, such as rapid thermal anneal, laser-based anneal, flashlight-based anneal and the like, wherein a temperature may be used in the range of approximately 700-1100° C. and higher, if required. Hence, upon re-crystallizing the layer 108B, a desired compressive strain component 108C, which may thus contribute to the overall strain in the channel region 152, may be obtained.

Figure 1H:
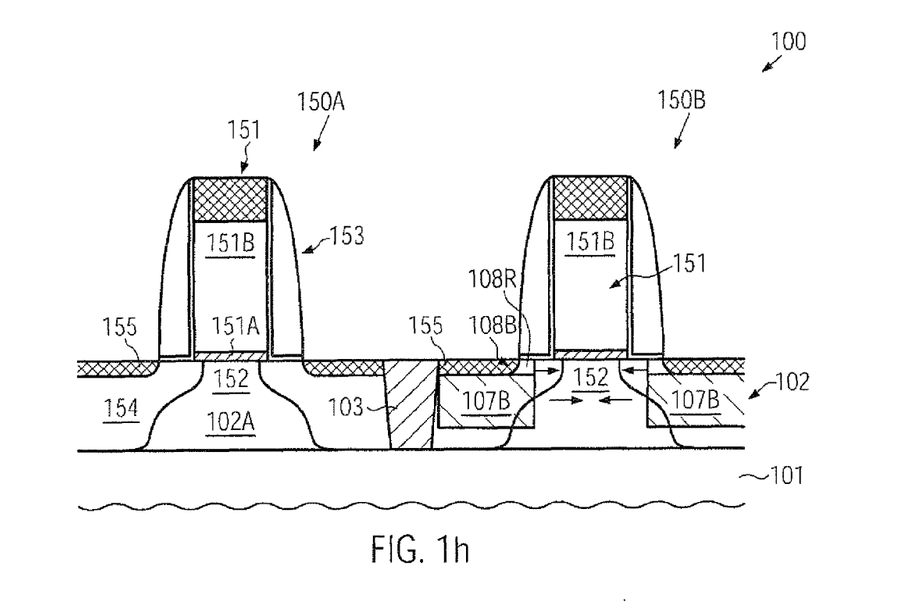
FIG. 1h schematically illustrates the semiconductor device in a further advanced manufacturing stage when metal silicide regions are formed in the silicon-containing semiconductor material, according to illustrative embodiments.

FIG. 1*h* schematically illustrates the semiconductor device 100 in a further advanced manufacturing stage. As illustrated, the transistors 150A, 150B may comprise the gate electrode structures 151 with a spacer structure 153, which may be comprised of any appropriate materials, such as silicon dioxide, silicon nitride and the like. Furthermore, drain and source regions 154 may be formed in the active regions 102A, 102B, respectively. In the embodiment shown, the drain and source regions 154 of the transistor 150B may at least be partially formed within the silicon/germanium alloy 107B, while, in other cases, any other configuration and spatial relation between the silicon/germanium alloy 107B and the drain and source regions 154 may be applied. Furthermore, metal silicide regions 155 are formed in the drain and source regions 154 and possibly in the gate electrode structures 151. In one illustrative embodiment, as shown in FIG. 1*h*, the metal silicide regions 155 of the transistor 150B may be formed so as to be accommodated by the cap layer 108B, that is, the silicon consumption during the corresponding silicidation process may be restricted to the layer 108B so that germanium concentration of the metal silicide regions 155 may be significantly less compared to the germanium concentration in the alloy 107B. As previously indicated, in some illustrative embodiments, the layer 108B may be provided with a germanium concentration of approximately 0, thereby also maintaining the germanium concentration in the metal silicide region 155 at a very low level. In some illustrative embodiments, the metal silicide 155 of the transistor 150B may comprise an additional atomic species, such as tin, so that a remaining portion 108R, which may substantially not take part in the corresponding silicidation process, may still provide a compressive strain component.

The semiconductor device 100 as illustrated in FIG. 1*h* may be formed on the basis of the following processes. After forming the materials 107B and 108B, as previously described, the spacer layer 104 and the spacer elements 104B in combination with the cap layers 151C (FIG. 1*g*) may be removed and the further processing may be continued by performing appropriate implantation processes on the basis of well-established techniques. Moreover, the spacer structure 153 may be formed in accordance with process and device requirements so as to act as an implantation mask, at least at various stages of the implantation sequence, in order to establish the desired vertical and lateral dopant profile for the drain and source regions 154. Thereafter, one or more anneal processes may be performed to activate the dopants and re-crystallize implantation-induced damage. It should be appreciated that the layer 108B may provide superior process conditions with respect to material loss and the like during this manufacturing sequence so that a similar behavior in the active regions 102A, 102B may be achieved due to the lack of germanium or due to a significantly reduced concentration of non-silicon species in the layer 108B. Next, the device 100 may be prepared for depositing a refractory metal, such as nickel, platinum and the like, which may be accomplished on the basis of well-established cleaning recipes. Thereafter, a layer of refractory metal may be deposited and subsequently one or more heat treatments may be performed so as to initiate a chemical reaction. As previously explained, the metal silicide 155 may be reliably formed in a stable manner in the layer 108B due to the reduced degree of germanium or due to the substantial absence of germanium species, thereby obtaining similar conditions for the transistors 150A and 150B. As previously explained, a corresponding "consumption" of silicon material in the layer 108B may be determined in advance so as to restrict the formation of the metal silicide 155 to the layer 108B. Consequently, a superior overall series resistance may be obtained for the transistor 150B, although a significantly high germanium concentration may be used in the alloy 107B. In this manner, a moderately low loss of strain may be compensated for in view of the overall performance of the transistor 150B. In other cases, when the remaining region 108R may still provide a compressive strain component, the overall strain in the channel region 152 may even be increased compared to conventional strategies, while, additionally, a superior contact resistance may be achieved.

Thereafter, the further processing may be continued, for instance by depositing an interlayer dielectric material (not shown) and patterning the same, wherein the reliable and stable characteristics of the metal silicide 155 in the transistors 150A, 150B may provide a predictable and reliable etch behavior during the patterning of the interlayer dielectric material.

Figure 1I:
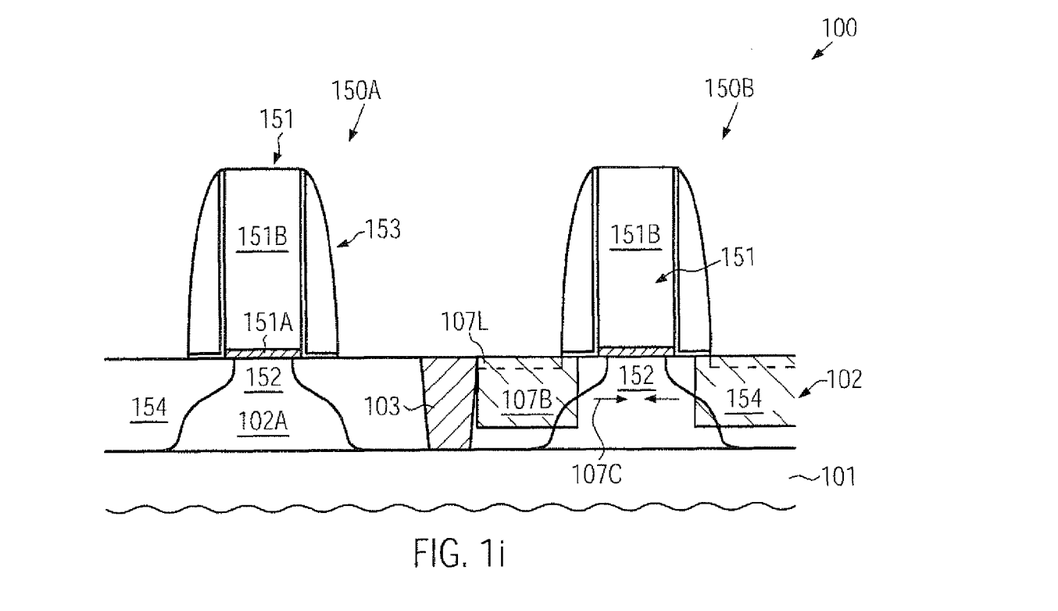
FIGS. 1i-1j schematically illustrate cross-sectional views of the semiconductor device according to still further illustrative embodiments in which a silicon-containing semiconductor material may be formed on a silicon/germanium alloy in a late manufacturing stage, i.e., after forming the drain and source regions in order to enhance performance of a corresponding metal silicide formation sequence.

FIG. 1*i* schematically illustrates the semiconductor device 100 according to still further illustrative embodiments in which a silicon-containing semiconductor material may be formed in a later manufacturing stage. As illustrated, the device 100 may comprise the transistors 150A, 150B in a substantially completed configuration except for metal silicide regions. That is, the transistor 150B may comprise the silicon/germanium alloy 107B with a desired high germanium concentration in order to obtain the desired high strain component 107C. With respect to any manufacturing strategies for forming the transistors 150A, 150B as shown in FIG. 1*i*, it may be referred to the embodiments previously described. That is, the silicon/germanium alloy 107B may be formed on the basis of a selective epitaxial growth process in order to provide the material 107B with the desired high germanium concentration without providing an excessive overfill behavior. Consequently, during the further processing, a more or less pronounced material loss may occur, as indicated by the dashed line 107L, due to high germanium concentration, as previously explained.

Figure 1J:
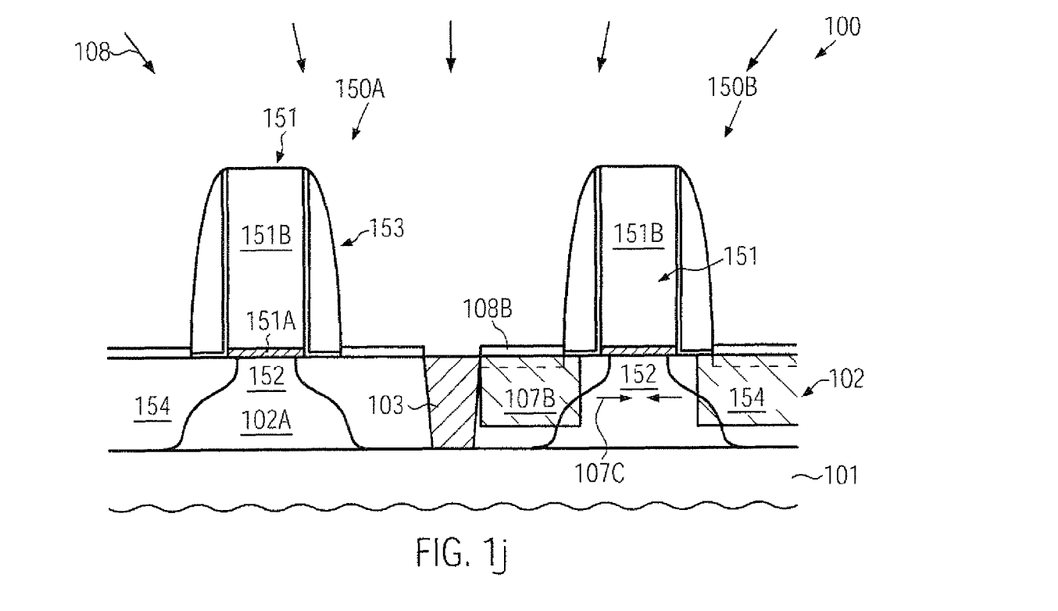

FIG. 1j schematically illustrates the semiconductor device 100 during a selective epitaxial growth process 108, which may be performed, for instance, prior to the deposition of a refractory metal. For example, the device 100 may be subjected to appropriate cleaning processes and may then be exposed to the deposition ambient of the process 108. During the process 108, a silicon material may be deposited selectively on exposed silicon-containing semiconductor areas, such as the drain and source areas 154 of the transistors 150A, 150B, and on the gate electrode structures 151, if comprising a silicon or silicon/germanium material. Consequently, a cap layer 108B may be provided above the drain and source regions 154, which may then be consumed during the subsequent silicidation process, thereby providing the stable metal silicide in the transistor 150B. It should be appreciated that the layer 108B may not negatively affect the silicidation process in the transistor 150A since, in this transistor, a certain degree of material loss may also have occurred, however, with a lesser degree compared to the transistor 150B.

Consequently, after the deposition of the material 108B, the further processing may be continued, for instance, by depositing a refractory metal and converting the same into metal silicide within the material layers 108B. Consequently, a stable metal silicide may be provided in the transistor 150B, while at the same time providing a high compressive strain component due to the high germanium concentration in the material 107B, which may be formed up to any desired height level in the corresponding selective epitaxial growth process.

As a result, the present disclosure provides semiconductor devices and manufacturing techniques in which a superior performance of silicon/germanium alloy-containing active regions may be achieved during a silicidation process by providing a semiconductor cap material at an appropriate manufacturing stage. Consequently, an efficient strain-inducing mechanism may be obtained for P-channel transistors, while at the same time the overall series resistance may be reduced due to the provision of a reliable and stable metal silicide, such as a nickel silicide, a nickel/platinum silicide and the like. Consequently, the principles disclosed herein may be advantageously applied to sophisticated transistor elements having a gate length of approximately 50 nm and less, since, in this case, a synergetic effect of various characteristics, such as strain in the channel region, contact resistance, performance during the formation of contact elements and the like, may have a significant effect on the overall performance of the semiconductor device.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a cavity in a semiconductor region laterally adjacent to a gate electrode structure of a transistor;
    forming a strain-inducing silicon/germanium alloy in said cavity, said silicon/germanium alloy having a first silicon concentration;
    forming a silicon-containing semiconductor material on said strain-inducing silicon/germanium alloy, said silicon-containing semiconductor material having a second silicon concentration that is greater than said first silicon concentration and a germanium concentration that is less than approximately 5 atomic percent;
    forming drain and source regions at least partially in said silicon/germanium alloy and said silicon-containing semiconductor material; and
    forming a metal silicide in said silicon-containing semiconductor material.

2. The method of claim 1, wherein said silicon-containing semiconductor material comprises germanium.

3. The method of claim 2, wherein said germanium concentration is less than approximately 1 atomic percent.

4. The method of claim 1, wherein said silicon-containing semiconductor material is formed so as to contain an atomic species having a covalent radius that is greater than a covalent radius of germanium.

5. The method of claim 4, wherein said atomic species comprises tin.

6. The method of claim 4, wherein forming said silicon-containing semiconductor material comprises performing a selective epitaxial growth process.

7. The method of claim 1, wherein said silicon-containing semiconductor material and said silicon/germanium alloy are formed in situ.

8. The method of claim 1, wherein forming said silicon-containing semiconductor material comprises forming a silicon layer on said silicon/germanium alloy and introducing said atomic species into said silicon layer by performing an ion implantation process.

9. The method of claim 1, wherein forming said metal silicide comprises adapting a thickness of said silicon-containing semiconductor material so as to create said metal silicide within said silicon-containing semiconductor material.

10. The method of claim 1, wherein a germanium concentration of said silicon/germanium alloy is approximately 25 atomic percent or higher.

11. The method of claim 1, wherein forming said metal silicide comprises depositing at least one of nickel and platinum and performing a heat treatment to initiate a chemical reaction of said at least one of nickel and platinum and the silicon of said silicon-containing semiconductor material.

12. A method, comprising:
    forming a cavity in a semiconductor region laterally adjacent to a gate electrode structure of a transistor;
    forming a strain-inducing silicon/germanium alloy in said cavity, said silicon/germanium alloy having a first silicon concentration;
    forming a silicon-containing semiconductor material on said strain-inducing silicon/germanium alloy, said silicon-containing semiconductor material comprising germanium and having a second silicon concentration that is greater than said first silicon concentration, wherein a germanium concentration of said silicon-containing semiconductor material is less than approximately 1 atomic percent;
    forming drain and source regions at least partially in said silicon/germanium alloy and said silicon-containing semiconductor material; and
    forming a metal silicide in said silicon-containing semiconductor material.

13. A method, comprising:
    forming a silicon-containing semiconductor material on a silicon/germanium alloy formed in an active region of a P-type transistor, wherein forming said silicon-containing semiconductor material comprises incorporating an atomic species having a greater covalent radius than germanium into a silicon base material, said silicon-containing semiconductor material having a germanium concentration that is less than a germanium concentration of said silicon/germanium alloy; and forming a metal silicide locally restricted to said silicon-containing semiconductor material.

14. The method of claim 13, wherein said silicon/germanium alloy and said silicon-containing semiconductor material are formed in situ by performing a selective epitaxial growth process.

15. The method of claim 13, further comprising forming drain and source regions in said active region after forming said silicon/germanium alloy and prior to forming said silicon-containing semiconductor material.

16. The method of claim 13, wherein said atomic species is incorporated by performing a selective epitaxial growth process using a precursor containing silicon and said atomic species.

17. The method of claim 13, wherein said atomic species is incorporated by performing an ion implantation process.

18. The method of claim 13, wherein said atomic species comprises tin.

* * * * *